United States Patent
Saito et al.

(10) Patent No.: US 8,460,957 B2
(45) Date of Patent: Jun. 11, 2013

(54) OPTICAL SEMICONDUCTOR DEVICE, METHOD FOR MANUFACTURING OPTICAL SEMICONDUCTOR DEVICE, AND METHOD FOR MANUFACTURING OPTICAL SEMICONDUCTOR APPARATUS

(75) Inventors: Tatsuma Saito, Tokyo (JP); Yusuke Yokobayashi, Tokyo (JP)

(73) Assignee: Stanley Electric Co., Ltd., Tokyo (JP)

( * ) Notice: Subject to any disclaimer, the term of this patent is extended or adjusted under 35 U.S.C. 154(b) by 394 days.

(21) Appl. No.: 12/911,022

(22) Filed: Oct. 25, 2010

(65) Prior Publication Data

US 2011/0095330 A1 Apr. 28, 2011

(30) Foreign Application Priority Data

Oct. 23, 2009 (JP) ................................ 2009-244320

(51) Int. Cl.
*H01L 21/00* (2006.01)
(52) U.S. Cl.
USPC ............. 438/46; 438/455; 438/460; 438/464; 438/766; 257/E21.122; 257/E21.172; 257/E21.599; 257/E33.005
(58) Field of Classification Search
USPC ............... 438/46, 47, 59, 455–464, 766, 795; 257/E21.12–122, 172, 347, 599, E33.005–6
See application file for complete search history.

(56) References Cited

U.S. PATENT DOCUMENTS

| 6,562,648 | B1 * | 5/2003 | Wong et al. ..................... 438/46 |
| 7,029,939 | B2 * | 4/2006 | Chiyo et al. .................... 438/47 |
| 7,202,141 | B2 * | 4/2007 | Park et al. ..................... 438/458 |
| 7,261,776 | B2 * | 8/2007 | Rupich et al. .................. 117/89 |
| 7,718,269 | B2 * | 5/2010 | Takayasu et al. ............. 428/450 |
| 7,822,087 | B2 * | 10/2010 | Hata et al. .................. 372/43.01 |
| 8,168,459 | B2 * | 5/2012 | Iwayama et al. ............... 438/39 |
| 2008/0280424 | A1 * | 11/2008 | Yamazaki et al. ............ 438/480 |

FOREIGN PATENT DOCUMENTS

JP 3896044 B2 12/2006

* cited by examiner

*Primary Examiner* — Michael Lebentritt

(74) *Attorney, Agent, or Firm* — Holtz, Holtz, Goodman & Chick, P.C.

(57) ABSTRACT

A method for manufacturing a high quality optical semiconductor device includes: (a) preparing a growth substrate; (b) forming a semiconductor layer on the growth substrate; (c) forming a metal support made of copper on the semiconductor layer by plating; (d) separating the growth substrate from the semiconductor layer to remove the growth substrate; and (e) carrying out a thermal treatment in order to even density distributions of crystal grains and voids in the copper forming the metal support.

22 Claims, 9 Drawing Sheets

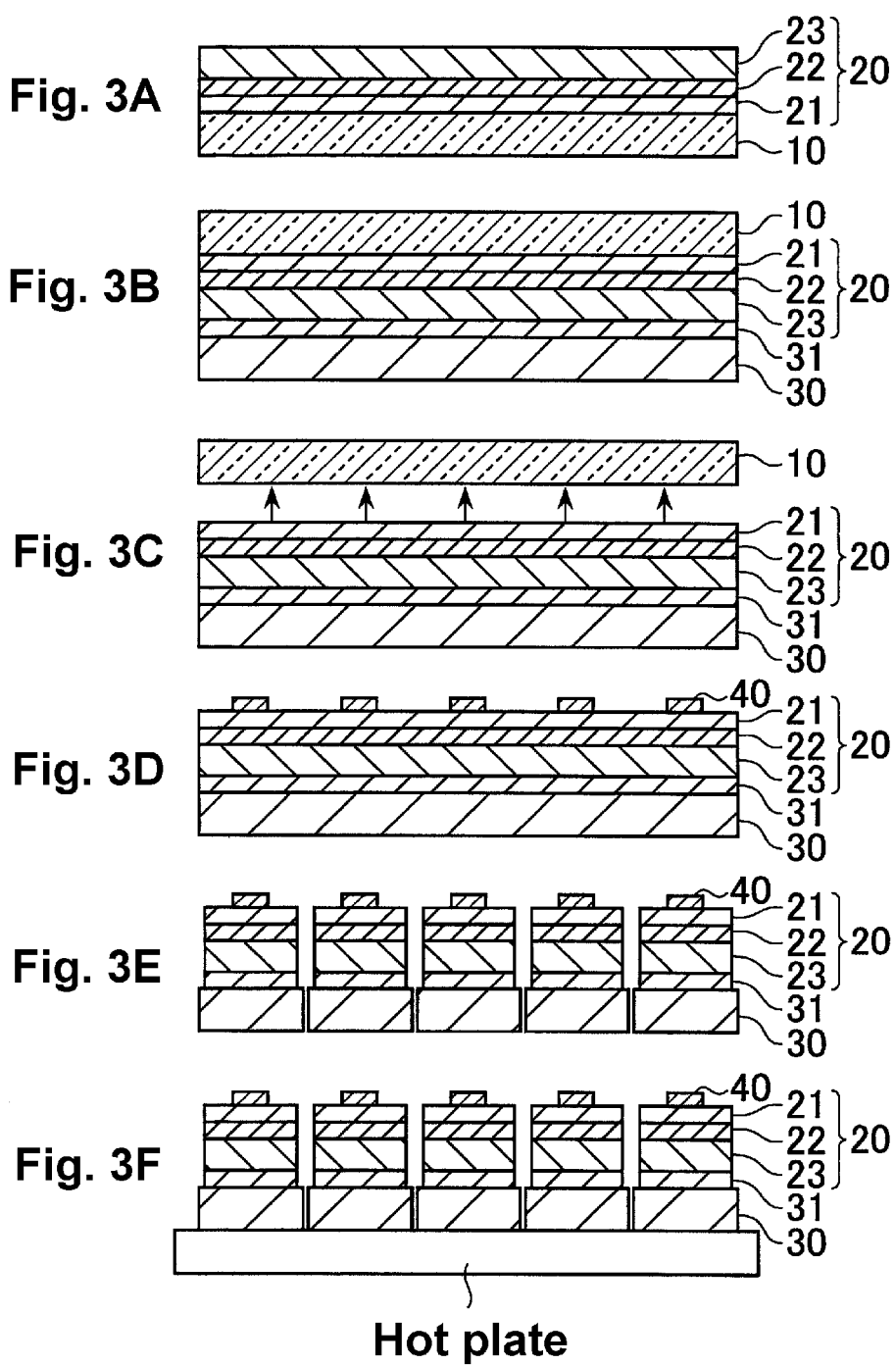

OPTICAL SEMICONDUCTOR DEVICE, METHOD FOR MANUFACTURING OPTICAL SEMICONDUCTOR DEVICE, AND METHOD FOR MANUFACTURING OPTICAL SEMICONDUCTOR APPARATUS

This application claims the priority benefit under 35 U.S.C. §119 of Japanese Patent Application No. 2009-244320 filed on Oct. 23, 2009, which is hereby incorporated in its entirety by reference.

TECHNICAL FIELD

The present invention relates to an optical semiconductor device, a method for manufacturing the same, and a method for manufacturing an optical semiconductor apparatus.

BACKGROUND ART

Recent optical semiconductor devices have been improved in efficiency, so that the applications thereof have been widespread not only to light sources for display devices such as a backlight for a liquid display device but also to the lighting fixture field including general lighting fixtures, lights for vehicle lights, and the like.

For example, if such an optical semiconductor device is applied to a backlight light source for a liquid display of a cell phone, the optical semiconductor device can be driven with a current of approximately 20 mA. On the contrary, if such an optical semiconductor device is applied to a lighting fixture for a vehicle light, for example, the optical semiconductor device can be driven with a current of approximately 1 A. The increase in driving current can cause higher heat generation from the optical semiconductor device. If an optical semiconductor apparatus utilizes such a high output optical semiconductor device, certain measures must be taken for efficient dissipation of generated heat.

A known optical semiconductor device disclosed in Japanese Patent No. 3896044 includes an optical semiconductor layer and a metal plate with high heat conduction formed on the optical semiconductor layer while a sapphire substrate has been removed, thereby improving the heat dissipation property.

FIG. 1 is a flow chart showing a conventional manufacturing process of an optical semiconductor device with a metal plate and an optical semiconductor apparatus including the same.

The manufacturing process includes a semiconductor layer formation step, a metal support formation step, a growth substrate removal step, an n-electrode formation step, and a separation step (chipping step). First, in the semiconductor layer formation step a semiconductor layer is formed on a growth substrate. The semiconductor layer can be formed by, for example, metal organic chemical vapor deposition method (MOCVD). Next, in the metal support formation step, a metal film is deposited on the semiconductor layer, and then, the metal film is plated to form a metal plate (plating film). In the growth substrate removal step, the growth substrate is removed to expose the semiconductor layer. Then, in the n-electrode formation step, an n-electrode is formed on the exposed semiconductor layer, and the semiconductor layer and the metal plate are separated together in the separation step, thereby completing individual optical semiconductor devices as chips.

Furthermore, the optical semiconductor device is packaged to be utilized as an optical semiconductor apparatus by die-bonding, wire-bonding, and resin sealing. In the die-bonding step, the metal plate of the optical semiconductor device is fixed to one of a pair of stems via a conductive adhesive. In the wire-bonding step, the n-electrode is electrically connected with the other stem via a gold (Au) wire. In the resin sealing step, at least part of the stems, the optical semiconductor device and the Au wire are sealed with a light transmitting resin, thereby manufacturing the optical semiconductor apparatus.

The conductive adhesive in the die-bonding step can be an AuSn solder (Au: 80 wt %) with favorable heat conduction and electric conduction, for example. The AuSn solder is applied to the stem or the optical semiconductor device, followed by heating it in a reflow furnace at approximately 315° C. to form an AuSn eutectic junction. During this process, the semiconductor layer may be broken by forces applied to the semiconductor layer due to the difference in thermal expansion coefficient between the semiconductor layer and the metal plate, and the density distribution unevenness of the inside of the metal plate.

If the Au content in the AuSn solder is set to 10 wt %, for example, the eutectic temperature can be lowered to approximately 210° C. In this case, the problem in which the semiconductor layer is broken can be prevented to a certain extent. Even when the difference in thermal expansion coefficient between the semiconductor layer and the metal plate is not changed, if the Au content is decreased, the eutectic junction can be formed within a temperature range in which the thermal expansion of the metal plate cannot break the semiconductor layer.

However, if such an AuSn solder having a low Au content is used for manufacturing an optical semiconductor apparatus, when the manufactured optical semiconductor apparatus is heated (for example, 250° C.) to be soldered to a printed board or the like, the optical semiconductor device or stems may be peeled off. In this case, the device failure may occur. This is because the AuSn solder with the low Au content can be re-melted at the temperature of 250° C., thereby significantly weakening the bonding strength between the optical semiconductor device and the stems.

SUMMARY

The present invention was devised in view of these and other problems and features and in association with the conventional art. An aspect of the present invention can provide an optical semiconductor device that can be utilized in manufacturing a high quality optical semiconductor apparatus, and a method for manufacturing the optical semiconductor device.

Also, another aspect of the present invention can provide a method for manufacturing a high quality optical semiconductor apparatus.

Still another aspect of the present invention can provide a method for manufacturing an optical semiconductor device, including: (a) preparing a growth substrate; (b) forming a semiconductor layer on the growth substrate; (c) forming a metal support made of copper on the semiconductor layer by plating; (d) separating the growth substrate from the semiconductor layer to remove the growth substrate; and (e) carrying out a thermal treatment in order to even density distributions of crystal grains and voids in the copper forming the metal support.

A further another aspect of the present invention can provide a method for manufacturing an optical semiconductor apparatus, including: (a) preparing a growth substrate; (b) forming a semiconductor layer on the growth substrate; (c) forming a metal support made of copper on the semiconductor layer by plating; (d) separating the growth substrate from the semiconductor layer to remove the growth substrate; (e) carrying out a thermal treatment in order to even density distributions of crystal grains and voids in the copper forming the metal support; and (f) forming a eutectic junction between the metal support and a conductive member using an AuSn solder with an Au content of 78 to 80 wt %.

Still another aspect of the present invention can provide an optical semiconductor device can include a metal support formed of copper by plating, and a semiconductor layer formed on the metal support, wherein a particle diameter of all crystal grains in the metal support in a range of 5 μm in a thickness direction from a boundary between the metal support and the semiconductor layer is 3 μm or less.

The present invention of the above configuration can provide an optical semiconductor device for use in manufacturing a high quality optical semiconductor apparatus and a method for manufacturing the same.

Also, the present invention can provide a method for manufacturing a high quality optical semiconductor apparatus.

BRIEF DESCRIPTION OF DRAWINGS

These and other characteristics, features, and advantages of the present invention will become clear from the following description with reference to the accompanying drawings, wherein:

FIGS. 3A to 3F are cross sectional views illustrating the optical semiconductor device in respective manufacturing steps according to the embodiment of the present invention;

FIGS. 5A and 5B are graphs showing the temperature change during the thermal treatment step and the like;

DESCRIPTION OF EXEMPLARY EMBODIMENTS

A description will now be made below to optical semiconductor devices and optical semiconductor apparatuses of the present invention with reference to FIGS. 2 to 5B in accordance with exemplary embodiments.

Figure 2:
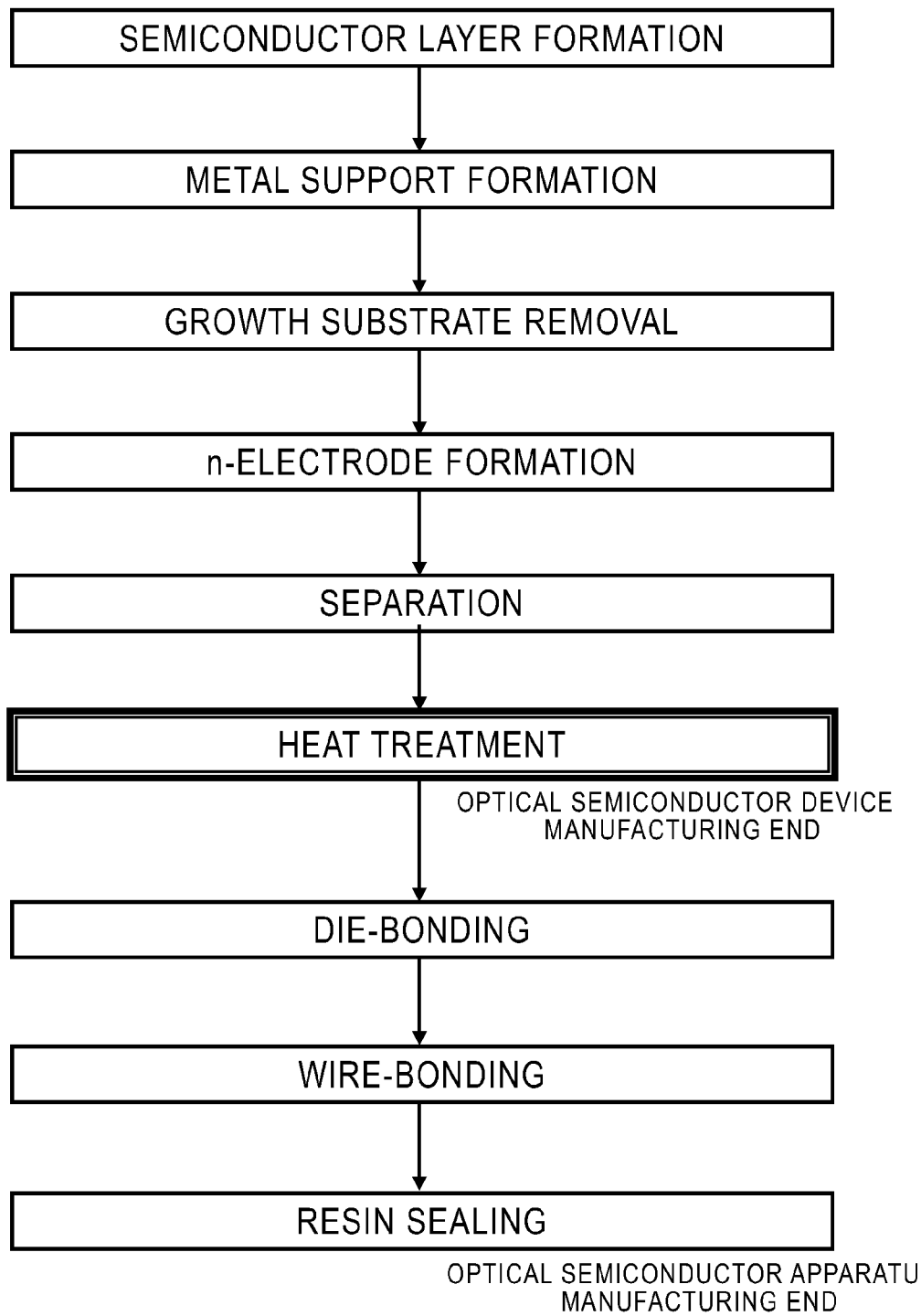
FIG. 2 is a flow chart showing a manufacturing process of an optical semiconductor device with a metal plate and an optical semiconductor apparatus including the same according to one embodiment of the present invention.

FIG. 2 is a flow chart showing a manufacturing process of an optical semiconductor device and an optical semiconductor apparatus according to one embodiment of the present invention. The manufacturing process of the optical semiconductor device of the present exemplary embodiment can include a semiconductor layer formation step, a metal support formation step, a growth substrate removal step, an n-electrode formation step, a separation step (chipping step), and a thermal treatment step. The manufacturing process of the optical semiconductor apparatus of the present exemplary embodiment can include a die-bonding step, a wire-bonding step, and a resin sealing step in addition to the above process.

Figure 1:
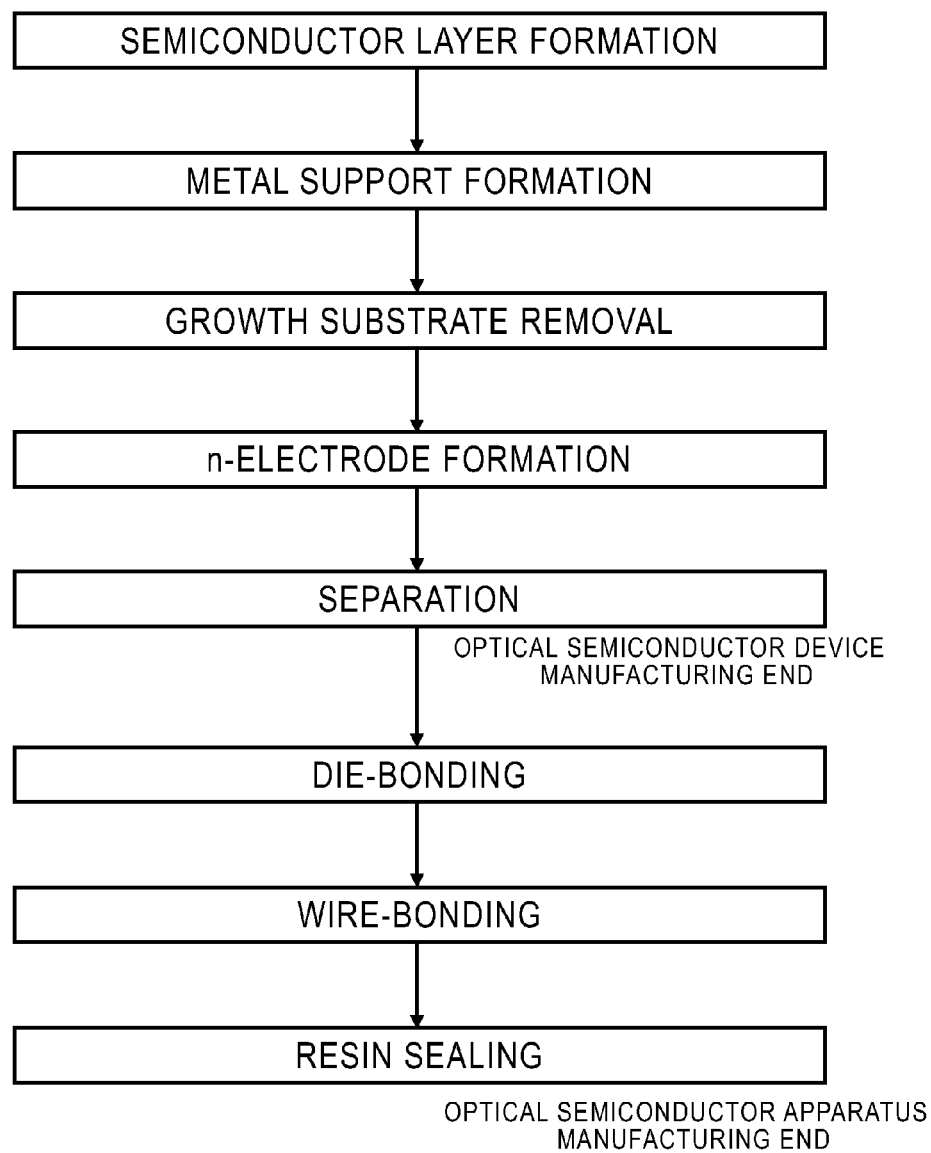
FIG. 1 is a flow chart showing a conventional manufacturing process of an optical semiconductor device with a metal plate and an optical semiconductor apparatus including the same.

The difference from the flow chart of FIG. 1 is to include the thermal treatment step after the separation step. The thermal treatment step can be carried out in between the growth substrate removal step and the n-electrode formation step, or between the n-electrode formation step and the separation step. The number of performing the thermal treatment step is not limited to one, but the thermal treatment step can be carried out, for example, after the growth substrate removal step and again after the separation step, total twice.

With reference to FIGS. 3A to 3F, a detailed description will be given of the method for manufacturing the optical semiconductor device according to the embodiment of the present invention.

FIG. 3A is a schematic cross sectional view illustrating the semiconductor formation step. In this step, a growth substrate, for example, a C-plane sapphire substrate 10 is prepared. The C-plane sapphire substrate 10 can be used to grow a group III nitride semiconductor film represented by $Al_xIn_yGa_zN$ (wherein $0 \leq x \leq 1$, $0 \leq y \leq 1$, $0 \leq z \leq 1$, $x+y+z=1$). Then, a semiconductor film 20 can be crystalline growth on the sapphire substrate 10 by means of MOCVD method, with the semiconductor film 20 including an n-type semiconductor layer 21, an active layer 22, and a p-type semiconductor layer 23 comprising $Al_xIn_yGa_zN$.

Specifically, the sapphire substrate 11 is transferred into an MOCVD apparatus, within which a thermal cleaning is performed first at 1000° C. for 10 minutes in a hydrogen atmosphere. Then, trimethyl gallium (TMG) (10.4 μmol/min) and $NH_3$ (3.3 LM (standard liter/min)) are supplied into the MOCVD apparatus at approximately 500° C. for 3 minutes to thereby form a low-temperature buffer layer (GaN layer) on the sapphire substrate 10. Then, the temperature of the sapphire substrate 10 is raised to 1000° C. and maintained for 30 seconds to crystallize the formed low-temperature buffer layer. Furthermore, while maintaining the temperature, TMG (45 μmol/min) and $NH_3$ (4.4 LM) are supplied for 20 minutes to thereby form a GaN underlayer with a thickness of approximately 1 μm on the low-temperature buffer layer. Then, TMG (45 μmol/min), $NH_3$ (4.4 LM), and $SiH_4$ ($2.7 \times 10^{-9}$ μmol/min) are supplied for 20 minutes at 1000° C. to thereby form an n-GaN layer (n-type semiconductor layer 21) with a thickness of approximately 7 μm on the GaN underlayer.

An active layer 22 having a multi quantum well structure including InGaN/GaN is formed on the n-type semiconductor layer 21. For example, suppose a case that one cycle includes InGaN/GaN formation. In this case crystalline are formed by performing the growth by repeating five cycles. Then, an InGaN well layer is formed by supplying TMG (3.6 μmol/min), trimethyl indium (TMI, 10 μmol/min), and $NH_3$ (4.4 LM) for 33 seconds at approximately 700° C. to have a thickness of approximately 2.2 nm. Then, a GaN barrier layer is formed by supplying TMG (3.6 μmol/min), and $NH_3$ (4.4 LM) for 320 seconds at approximately 700° C. to have a thickness of approximately 15 nm.

The temperature is raised to 870° C., and TMG (8.1 μmol/min), trimethyl aluminum (TMA, 7.5 μmol/min), $NH_3$ (4.4 LM), and cyclopentadienyl magnesium (Cp2Mg, $2.9 \times 10^{-7}$ μmol/min) are supplied for 5 minutes, thereby growing a p-AlGaN cladding layer with a thickness of approximately 40 nm on the active layer 22. While the temperature is maintained, TMG (18 μmol/min), $NH_3$ (4.4 LM), and Cp2Mg ($2.9 \times 10^{-7}$ μmol/min) are supplied for 7 minutes, thereby growing a p-GaN layer (p-type semiconductor layer 23) with a thickness of approximately 150 nm on the p-AlGaN cladding layer.

By doing so, the n-type semiconductor layer 21, the active layer 22, and the p-type semiconductor layer 23 are sequentially deposited in this order on the sapphire substrate 10, to thereby form the semiconductor film 20.

FIG. 3B is a schematic cross sectional view illustrating the metal support formation step. In this step, first a metal underlayer (p-electrode) 31 is formed on the p-type semiconductor layer 23 of the semiconductor film 20 by an electron beam deposition method. In this exemplary embodiment, the metal underlayer 31 can be formed of Pt/Ag/Ti/Pt/Au in this order. Then, the sapphire substrate 10 on which the semiconductor film 20 and the metal underlayer 31 have been formed is immersed into a plating bath to form a metal support 30 with a thickness of approximately 150 μm by means of copper electroplating.

Specifically, first, the Au surface serving as a conductive surface for plating as well as serving as a plating start surface is immersed into a diluted sulfuric acid solution for acid activation. Then, in order to prevent the copper plating layer from being diffused, a Ni plating layer with a thickness of 2 μm is deposited in a mixed bath of nickel sulfate and nickel chloride. Then, a copper plating layer with a thickness of 150 μm is deposited in a copper sulfate bath to serve as a main support. In this case, the copper plating bath can include an organic lubricating agent, a brightener, and other additives for adjusting the mechanical properties such as stiffness, flatness, and the like of the plating. The current density during the formation of the copper plating layer can be 3 to 8 $A/dm^2$, and the preferable range of the current density may be 4 to 6 $A/dm^2$. Then, a nickel plating layer is formed in a nickel bath to have a thickness of 2 μm. Then, a gold plating is deposited to have a thickness of 300 nm as a final surface to be used as a surface for preventing the copper plating surface from being oxidized.

FIG. 3C is a schematic cross sectional view illustrating the growth substrate removal step. In this step, the growth substrate (sapphire substrate) 10 is removed to expose the surface of the n-type semiconductor layer 21 of the semiconductor film 20.

The removal of the sapphire substrate 10 can be carried out by a laser lift off method (LLO method) utilizing excimer laser (wavelength: 266 nm). Laser beam is projected on the sapphire substrate 10 side to decompose GaN present in the boundary between the sapphire substrate 10 and the semiconductor film 20 into gallium (Ga) and nitrogen ($N_2$), thereby peeling the sapphire substrate 10 off from the semiconductor film 20. Instead of the excimer laser, Nd:YAG laser can be used.

The removal of the sapphire substrate 10 can be achieved by grinding, polishing, reactive ion etching (RIE), or the like method. Instead of the sapphire substrate, the growth substrate can be an Si substrate, an SiC substrate, and the like substrate that can be dissolved by a specific solvent to remove the growth substrate with the chemical treatment.

FIG. 3D is a schematic cross sectional view illustrating the n-electrode formation step. In this step, an n-electrode 40 made of Ti/Pt/Au is formed at a predetermined position on the surface of the n-type semiconductor layer 21 that has been exposed by removing the sapphire substrate 10, by photolithography, electron beam deposition, or the like method. The thickness of the Ti layer of the n-electrode 40 can be 10 angstrom, that of the Pt layer is 1000 angstrom, and that of the Au layer is 15000 angstrom.

FIG. 3E is a schematic cross section illustrating the separation step. In this step, the wafer is divided into separate optical semiconductor devices as chips. The separation step can be carried out by removing predetermined areas of the semiconductor film 20, the metal under layer 31, and the metal support 30. The removal of the semiconductor film 20 (formation of a street line) can be carried out by etching after the area to be an optical semiconductor device by photolithography is protected. Examples of the etching used in this step include a wet etching in which the stacked body is immersed in an alkali solution such as KOH or NaOH solution, a dry etching like RIE, and a combination of these. Following the etching, the surface of the exposed metal underlayer 31 is irradiated with Nd:YAG laser to cut the metal underlayer 31 and the metal support 30, thereby dividing into individual optical semiconductor devices.

FIG. 3F is a schematic cross sectional view illustrating the thermal treatment step. In this step, the separated optical semiconductor device is heated, for example, on a hot plate. The heating is carried out in the atmosphere at a heat raising rate of 25° C./second up to 120° C., and then maintained for approximately 90 seconds. Then, the heated optical semiconductor device is transferred onto a metal plate for rapid cooling (approximately 25° C./second). The thermal treatment step will be described in more detail later.

In this manner, an optical semiconductor device that can emit light from the active layer by applying a certain voltage between the metal support 30 and the n-electrode 40 can be manufactured.

Figure 4A:
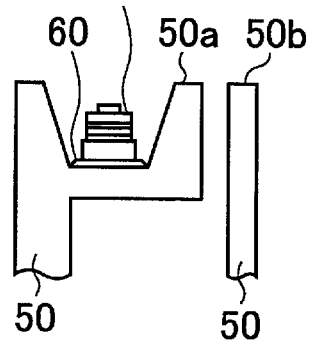
FIGS. 4A to 4C are schematic views illustrating the optical semiconductor apparatus in respective manufacturing steps according to one embodiment of the present invention.

FIG. 4A is a schematic cross sectional view illustrating the die-bonding step. In this step, the individual optical semiconductor device can be fixed to one 50a of a pair of metal stems 50 via an AuSn solder (conductive adhesive) 60. Specifically, the AuSn solder 60 is applied to the surface of the metal support of the optical semiconductor device and/or the stem 50a and then heated in an electric furnace to form a eutectic junction. In the present exemplary embodiment, the AuSn solder 60 has an Au composition of approximately 80 wt %, and heating at 315° C. for 90 seconds is performed to carry out eutectic bonding. In this case, the temperature may be raised by approximately 100° C./second up to 315° C. and thereafter lowered by 10° C./second.

The AuSn solder 60 to be used in the die-bonding step preferably has a composition of 78 to 80 wt % of Au. If the solder has a lower Au composition, the strength after eutectic bonding is relatively weak, so that separation may occur easily. In addition to this, the AuSn solder with the low Au composition may be easily affected by the repeated temperature variation.

The optical semiconductor apparatus may be exposed to high temperature after die-bonding, for example, in the process of heat curing of a sealing resin, in the soldering process in which the complete optical semiconductor apparatus is installed in a printed substrate or a product, and the like. In particular, when the optical semiconductor apparatus is soldered, heating at 200 to 280° C., specifically 250° C., is required. If the AuSn solder with a low Au composition is used, the AuSn eutectic portion may be re-melted during the soldering at 250° C. for installation. Accordingly, the junction strength of the optical semiconductor device may be significantly weakened, so that failures such as peeling off of the optical semiconductor device from the stem 50a can occur. Furthermore, the complete optical semiconductor apparatus may suffer a high temperature condition of approximately 150° C. due to the heat generated by the driven optical semiconductor device. In this case, the high temperature may adversely affect the AuSn solder with the low Au composition. On the other hand, the AuSn solder with an Au composition of 78 to 80 wt % has a eutectic temperature of approximately 286° C., and accordingly, the solder does not suffer melting in the later steps, meaning that the junction strength and resistance to temperature variation are superior.

Figure 4B:
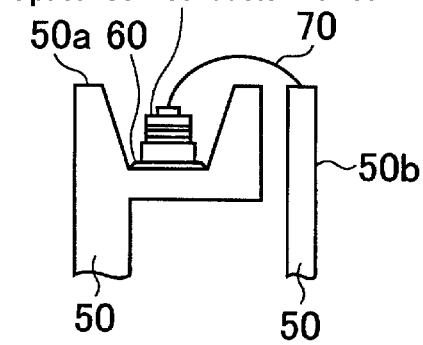

FIG. 4B is a schematic cross sectional view illustrating the wire-bonding step. In this step, the n-electrode of the optical semiconductor device can be electrically connected to the other stem 50b with an Au wire 70.

Figure 4C:
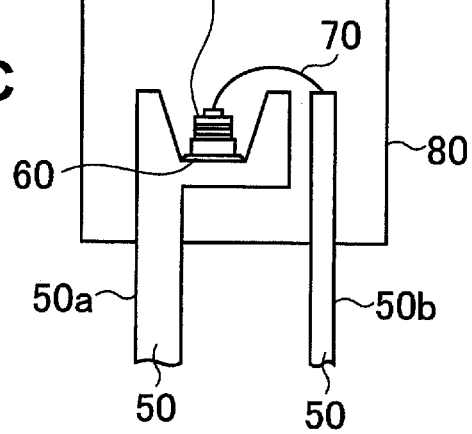

FIG. 4C is a schematic cross sectional view illustrating the resin sealing step. In this step, the optical semiconductor device, the Au wire 70, and part of the stems 50 (50a and 50b) can be sealed by an epoxy resin 80. Specifically, the sealing can be achieved by filling a resin sealing mold with a precursor of the epoxy resin, inserting the stems 50 with the optical semiconductor device and the Au wire 70 attached thereto into the resin precursor, and then heat curing the epoxy resin 80 in an electric furnace (for example, at approximately 150° C. for approximately 35 minutes). Examples of the sealing resin include, in addition to epoxy resins, acrylic resins, silicone resins, and the like.

In this manner, the optical semiconductor apparatus according to the present embodiment can be manufactured.

Figure 5A:
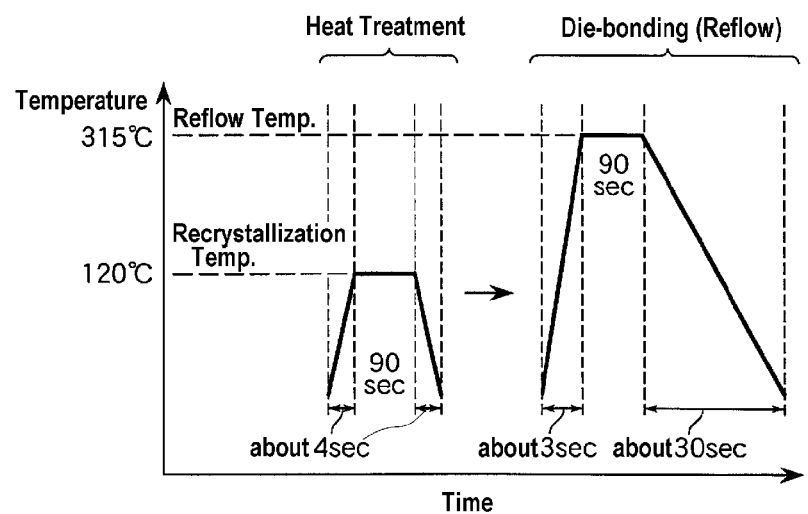
Figure 5B:
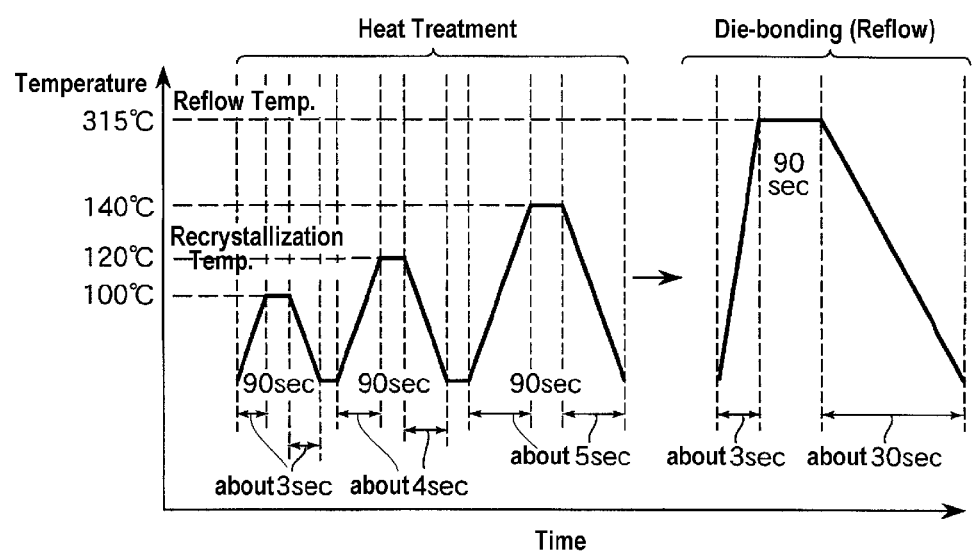

With reference to FIGS. 5A and 5B, the thermal treatment step will be detailed.

FIG. 5A is a graph showing the temperature change during the thermal treatment step illustrated with reference to FIG. 3F and during the die-bonding step illustrated with reference to FIG. 4A. The horizontal axis of the graph represents time in a unit of second while the vertical axis thereof represents temperature in a unit of ° C.

As illustrated in FIG. 3F, in the thermal treatment step the metal support of the optical semiconductor device is placed on a hot plate to be heated at a heat raising rate of 25° C./second up to 120° C. In this case, the heating time may be approximately 4 seconds. Then, the heated optical semiconductor device is kept being heated at 120° C. for approximately 90 seconds, and then is rapidly cooled at a temperature lowering rate of approximately 25° C./second. In this case, the cooling time may be approximately 4 seconds. The maximum temperature during the thermal treatment step in the present exemplary embodiment is up to 120° C., which does not limit the present invention. The maximum temperature during the thermal treatment step may range from 100° C. to 140° C., within which the advantageous effects of the present invention can be obtained.

As illustrated in FIG. 4A, in the die-bonding step, the AuSn solder is applied to the surface of the metal support of the optical semiconductor device and/or the stem and then heated (subjected to reflow process) in an electric furnace to form a eutectic junction. In this case, the temperature may be raised by approximately 100° C./second for approximately 3 seconds up to 315° C. and then the temperature may be maintained at 315° C. for 90 seconds. Then, the assembly of the optical semiconductor device and the stems is removed from the electric furnace, thereby lowering the temperature by approximately 10° C./second for approximately 30 seconds.

FIG. 5B is a graph showing another example of the thermal treatment step. The horizontal axis of the graph represents time in a unit of second while the vertical axis thereof represents temperature in a unit of ° C. The example illustrated in FIG. 5A includes the process in which the temperature of the optical semiconductor device is raised, maintained, and lowered once. As in the example illustrated in FIG. 5B, the raising, maintaining, and lowering of the temperature can be repeated while the maintaining temperature can be varied. In the illustrated example, it is preferred to increase the maintaining temperature gradually from the lower temperature.

Specifically, the first thermal treatment can be performed by placing the optical semiconductor device (metal support side) on a hot plate and heating for approximately 3 seconds. The temperature of the optical semiconductor device is raised by approximately 25° C./second up to 100° C. Then, the optical semiconductor device is maintained at 100° C. for 90 seconds. The heated optical semiconductor device is removed from the surface of the hot plate and placed on a metal base to be rapidly cooled by approximately 25° C./second for approximately 3 seconds.

The second thermal treatment can be performed by heating the optical semiconductor device by approximately 25° C./second for approximately 4 seconds. The temperature of the optical semiconductor device reaches 120° C. Then, the optical semiconductor device is maintained at 120° C. for 90 seconds. The heated optical semiconductor device is rapidly cooled by approximately 25° C./second for approximately 4 seconds.

The third thermal treatment can be performed by heating the optical semiconductor device by approximately 25° C./second for approximately 5 seconds. The temperature of the optical semiconductor device reaches 140° C. Then, the optical semiconductor device is maintained at 140° C. for 90 seconds. The heated optical semiconductor device is rapidly cooled by approximately 25° C./second for approximately 5 seconds.

The interval between the first and second thermal treatments may be 5 seconds, and the interval between the second and third thermal treatments may be 5 seconds.

The temperature change during the die-bonding step is also shown in FIG. 5B which is similar to that in FIG. 5A.

The method for manufacturing an optical semiconductor device/apparatus can include the specific thermal treatment step. The specific thermal treatment can prevent the cracking of semiconductor films after reflow process in the die-bonding step, which enables the method to manufacture the optical semiconductor device/apparatus without fail.

According to the present exemplary embodiment of the manufacturing method illustrated in FIGS. 2 to 5B, a high quality optical semiconductor device/apparatus can be manufactured.

Figure 6A:
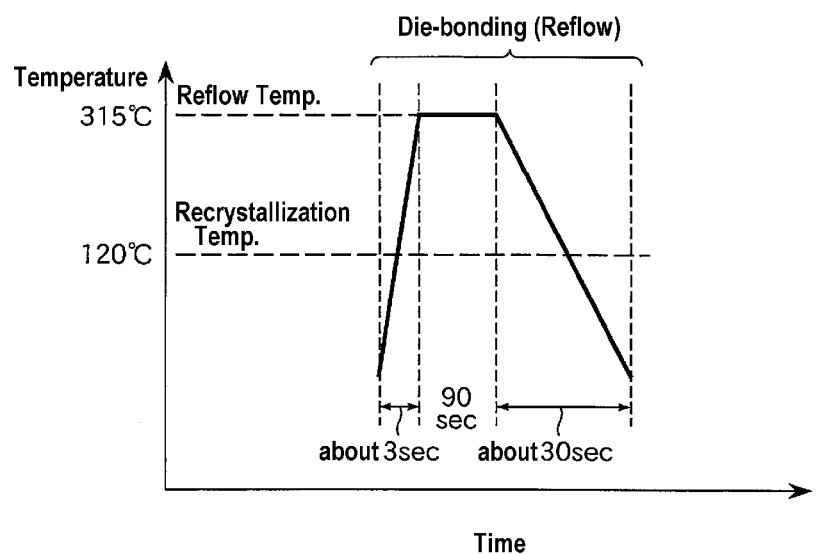
FIGS. 6A and 6B are graphs showing the temperature change with regard to first and second comparative examples during the die-bonding step.
Figure 6B:
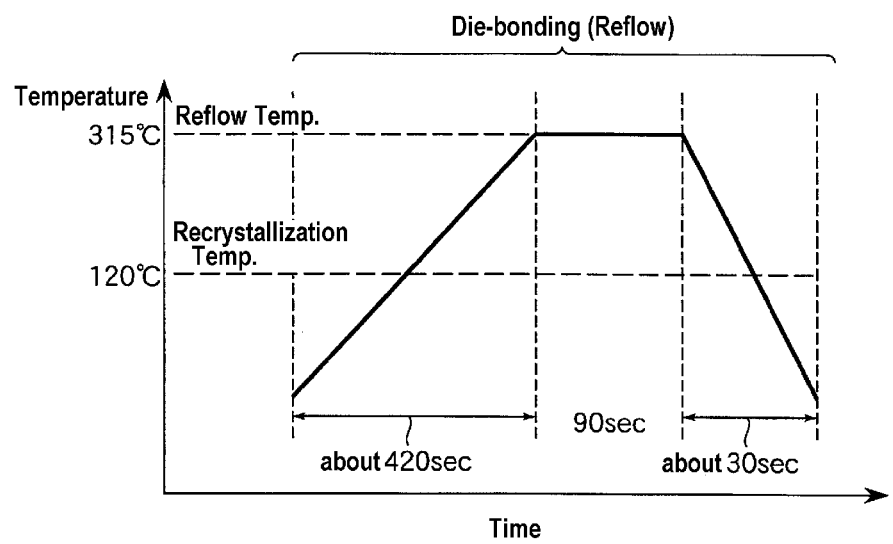
Figure 7:
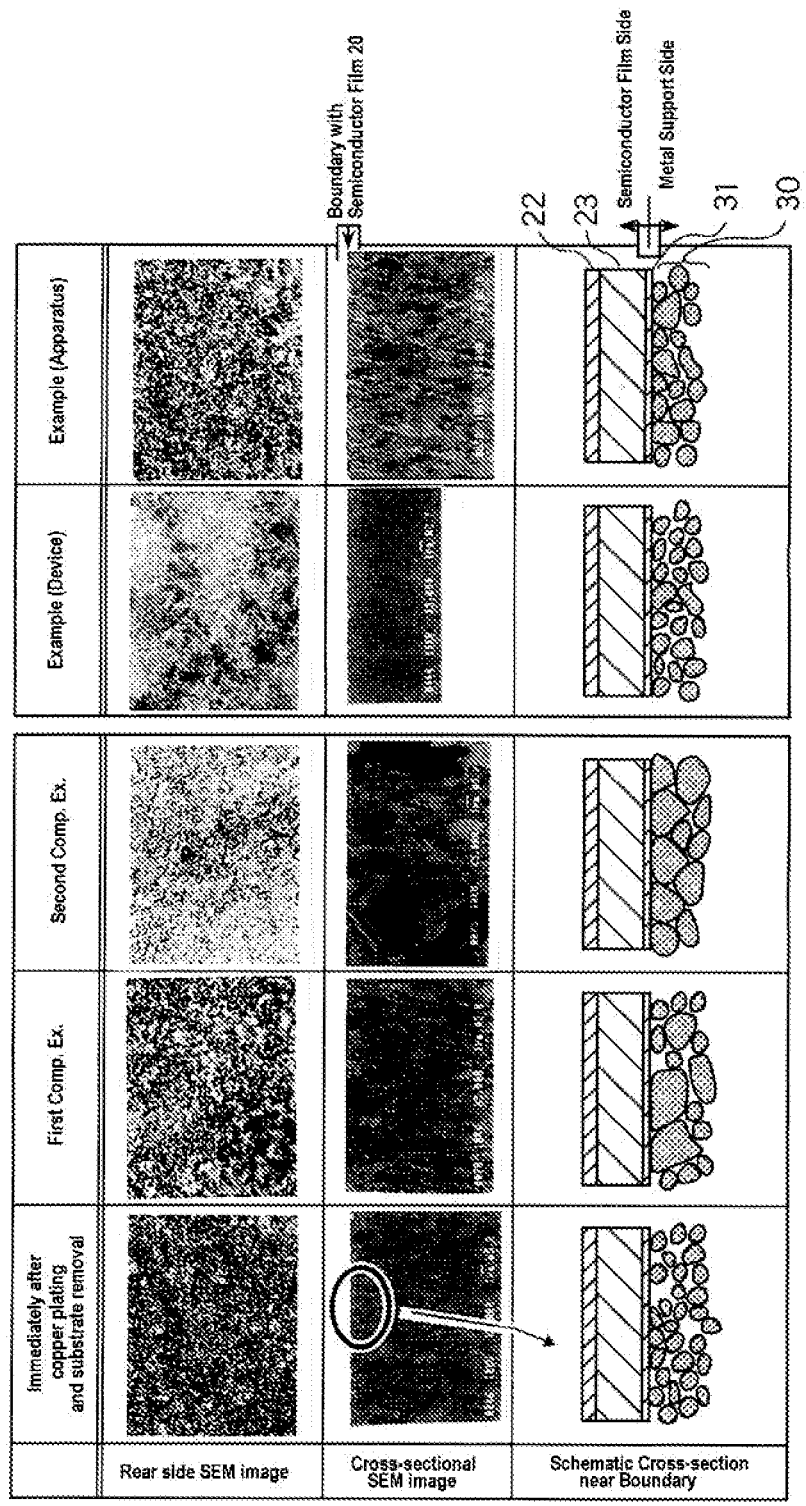
FIG. 7 is a table including SEM images of metal supports and schematic cross sectional views near the boundary between the metal support and the semiconductor film according to several examples and comparative examples.

Next, with reference to FIGS. 6A, 6B, and 7, comparative examples will be described to compare them with the optical semiconductor device/apparatus manufactured by the inventive manufacturing method according to the exemplary embodiment. In each comparative example, a device was manufactured by a method in which the present exemplary embodiment was repeated except for the thermal treatment step. Hereinafter, the device will be referred to as a comparative optical semiconductor device.

Each of the first and second comparative examples will be described with reference to FIGS. 6A and 6B.

The first comparative example illustrated in FIG. 6A is the case where a comparative optical semiconductor device is subjected to heat change treatment that is equal to the die-bonding step of the method for manufacturing the optical semiconductor apparatus of the present exemplary embodiment. Specifically, the separated individual device was placed on a hot plate and the temperature was raised by approximately 100° C./second up to 315° C. (which is equal to or higher than the eutectic temperature of the AuSn solder) thereafter maintained at 315° C. for 90 seconds, and lowered by 10° C./second for approximately 30 seconds. This device was employed as the first comparative example. Herein, it should be noted that the eutectic temperature of the AuSn solder with the Au content of 78 to 80 wt % is approximately 286° C. In the actual manufacturing steps, there is a case in which the AuSn eutectic junction cannot be obtained by heating it at a temperature lower than the eutectic temperature depending on the structure, material, and the like of the peripheral members of the optical semiconductor apparatus including the stems, the sealing resin and the like. Accordingly, in the present test, the die-bonding step was repeated at 315° C. which is a typical condition. FIG. 6A is a graph showing the temperature change to be applied to the device during the die-bonding step wherein the horizontal axis represents time in a unit of second while the vertical axis represents temperature in a unit of ° C.

20 pieces of the optical semiconductor device according to the first comparative example were manufactured and the semiconductor film of each optical semiconductor device was inspected. As a result, it was confirmed that all the semiconductor films were broken.

The second comparative example illustrated in FIG. 6B is the case where a comparative optical semiconductor device is subjected to heat change treatment that is different from the first comparative example. Specifically, the device according to the second comparative example was heated at approximately 0.7° C./second (that is significantly lower than that in the first comparative example) up to 315° C. for approximately 420 seconds, and thereafter maintained at 315° C. for 90 seconds. Then, the temperature was lowered by approximately 10° C./second for approximately 30 seconds.

20 pieces of the optical semiconductor device according to the second comparative example were manufactured and the semiconductor film of each optical semiconductor device was inspected. As a result, it was confirmed that all the semiconductor films were broken.

FIG. 7 is a table including SEM images of metal supports and schematic cross sectional views near the boundary between the metal support and the semiconductor film according to several examples and comparative examples. With reference to the drawing, a description will be given of the comparison between the optical semiconductor device and the apparatus manufactured by the manufacturing method of the present embodiment and those of the first and second comparative examples.

In FIG. 7, from the left column to the right column, the table includes the sample optical semiconductor device immediately after the metal support formation (copper plating) and growth substrate removal step, that of the first comparative example, that of the second comparative example and that of the present embodiment, and the sample optical semiconductor apparatus of the present embodiment. Further, from the upper row to the lower row, the table shows the rear side SEM image of the metal support (copper plate), the cross sectional SEM image thereof, and the schematic cross sectional view thereof near the boundary with the semiconductor film (in the depth direction from the boundary to the 4 to 5 µm depth). It should be noted that the "metal support" in the phrase of "boundary between the metal support and the semiconductor film" shall mean the metal underlayer 31" in addition to the "metal support 30".

In the cross sectional SEM images in the middle row, the upper side of the photograph corresponds to the boundary with the semiconductor film. With regard to the present embodiment of the optical semiconductor apparatus, in order to capture the rear side SEM image, the optical semiconductor device was subjected to temperature treatment equal to the die-bonding step and in actual, was not subjected to the steps after the die-bonding step.

First, a description will be given of the first column showing the samples immediately after the metal support formation and growth substrate removal step. The samples are common to both the examples and comparative examples. As can be seen from the rear side SEM image and the cross sectional SEM image, the crystal grains unevenly exist in the metal support (copper plate). This state is illustrated in the lower schematic cross sectional view. In this drawing, just after the metal support is formed by copper plate and the growth substrate is removed, the density distributions of the crystal grains of copper and the voids (gap between the crystal grains) are locally uneven.

Next, a description will be given of the first comparative example. As can be seen from the rear side SEM image and the cross sectional SEM image, the crystal grains of copper are varied in size in the metal support of the first comparative example. In particular, many coarse crystal grains could be observed at the metal under layer and from there to near the boundary of the metal support. This is because part of the crystal grains under the environment in which the crystal grains can easily grow has been excessively growth in the die-bonding step. Furthermore, the rear side SEM image has areas out of focus, meaning that the rear side of the metal support has large irregularities. It is assumed that this may be resulted from the unevenness of the density distributions of the copper crystal grains. It is believed that such irregularities can warp the thin semiconductor film, which would be a cause for generating a crack in the semiconductor film. It should be noted that the schematic cross sectional view illustrates the state where coarse crystal grains have been formed while the uneven density distributions of the crystal grains and voids are maintained.

Next, a description will be given of the second comparative example. As can be seen from the rear side SEM image and the cross sectional SEM image, remarkably large crystal grains are dispersed all over the metal support of the second comparative example. It is considered that during the long heating period the voids are removed by migration, recrystallization and the like, thereby excessively progressing the crystal grain growth all over the metal support. It should be noted that the schematic cross sectional view illustrates the state where many large coarse grains are formed by the sufficient migration and the growth of the crystal grains during the die-bonding step.

Next, a description will be given of the present embodiment (inventive optical semiconductor device). This column shows the sample optical semiconductor device according to the present embodiment. As can be seen from the rear side SEM image and the cross sectional SEM image, fine crystal grains are dispersed uniformly all over the metal support of the present embodiment. The particle diameter is approximately 1 µm. As used herein, the term "particle diameter" shall mean the maximum width of a crystal grain measured by observing a SEM image (the diameter of the smallest circle containing a crystal grain thereinside). In the metal support of the optical semiconductor device according to the present embodiment, the particle diameters of all of the crystal grains in a range of 5 µm in the thickness direction (which is perpendicular to the boundary) from the boundary between the metal support and the semiconductor layer are 3 µm or less, meaning that there is no crystal grain having a particle diameter larger than 3 µm. Furthermore, the maximum diameter in a constant direction along the boundary in the range of 5 µm in the thickness direction from the boundary is 3 µm or less.

When comparing with the cross sectional SEM image of the sample immediately after the metal support formation and growth substrate removal step, it can be clearly confirmed that the fine crystal grains are uniformly distributed in a region away from the boundary in the thickness direction. It is considered that the crystal grains that had been growing during temperature raising or maintained in the metal support formation step (copper plating) or the thermal treatment step would be separated during the cooling process in the thermal treatment step. The schematic cross sectional view illustrates the state where the growing crystal grains are changed into fine crystal grains due to the cooling in the thermal treatment step and finally the density distributions of the copper crystal grains and voids are evened.

Next, a description will be given of the next present embodiment (inventive optical semiconductor apparatus). This column shows the sample optical semiconductor device according to the present embodiment to which the temperature changed in accordance with the die-bonding step of the method for manufacturing an optical semiconductor apparatus according to the present invention was applied. As can be seen from the rear side SEM image and the cross sectional SEM image, it is confirmed that there is no coarse crystal grain, and the density distributions of the crystal grains and the voids are evened near the boundary between the semiconductor film and the metal support. When comparing with the cross sectional SEM image of the previous embodiment, the crystal grains in a region approximately 10 µm away from the boundary in the thickness direction become somewhat larger, whereas the particle diameters near the boundary (in the range of from the boundary to the 5 µm away region), which would relate to the generation of the cracking, are not changed as that before the heat application (which will be described later). The schematic cross sectional view illustrates the state where the excessive growth of crystal grains is suppressed and the appropriate density distribution of voids is achieved.

20 pieces of optical semiconductor devices according to the present embodiment were prepared to be subjected to temperature change in accordance with the die-bonding step, it has been revealed that no cracking of semiconductor film was observed. Accordingly, it was confirmed that the optical semiconductor device according to the present embodiment can stand die-bonding utilizing the AuSn solder with the Au content of 78 to 80 wt %. Since the AuSn solder with the Au content of 78 to 80 wt % can be used, when the optical semiconductor device is exposed to heat (for example, around 250° C.) for soldering the device to a printed circuit board, there is no failure such as a peeling of the optical semiconductor device.

Although it is uncertain, the present inventors have considered the reason why the optical semiconductor device and the optical semiconductor apparatus manufactured by the manufacturing method according to the present invention can have a semiconductor film without cracking as follows.

First, the reason why the semiconductor films of the first and second comparative examples are broken will be considered with reference to FIGS. 8A to 8F.

After the metal support 30 is formed by copper plating, the growth substrate (sapphire substrate) 10 is removed. At this time, the stress that is inherently present in the semiconductor film 20 is released, so that the wafer is warped to be convex in the direction of the semiconductor film 20 side as in FIG. 8A. When the wafer is warped, uniform treatments cannot be achieved. Accordingly, the wafer is deformed by certain force applied thereto during the following steps in which the wafer is installed in various processing machines. If metal such as copper is deformed by force, an inner strain may occur within the metal. When such metal containing the inner strain is heated, the metal intends to restore the previous state in which the inner strain does not occur. This phenomenon may be considered to include recovery, recrystallization, and crystal grain growing in this order.

The recovery shall mean the process to release the inner strain while the crystal grains are maintained in shape. The recrystallization shall mean the replacement of the crystal grains having the inner strain with new crystal grains without inner stain. The crystal grain growing shall mean the phenomenon in which, if the recrystallized crystal grains are kept heating further, the adjacent crystal grains are fused to disappear the grain boundary and generate larger crystal grains. The temperature and required heating time for causing the recovery, recrystallization, and crystal grain growing are affected not only by the metal kind, but also by the degree of processing (the magnitude of inner strain), density, grain size, purity, and the like.

Figure 8A:
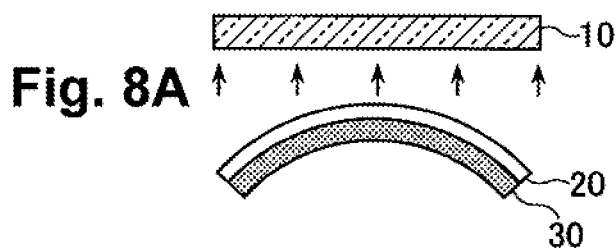
FIGS. 8A to 8F are cross sectional views illustrating how the breakage has been generated in the semiconductor films of the first and second comparative examples.
Figure 8B:
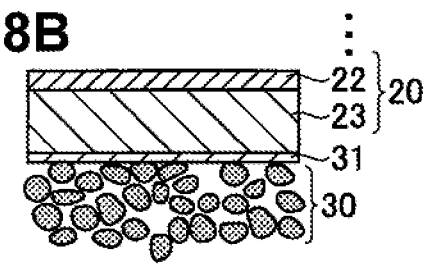

FIG. 8B is the same diagram as the schematic cross sectional view of the sample immediately after the metal support formation and growth substrate removal step in FIG. 7. As described above, the density distributions of the copper crystal grains and the voids are locally uneven immediately after the metal support 30 is formed by copper plating and the growth substrate 10 is removed. Accordingly, there are both the area where the copper crystal grains are closely gathered and the area where the voids are contained much (meaning less crystal grains) in the metal support 30.

Figure 8C:
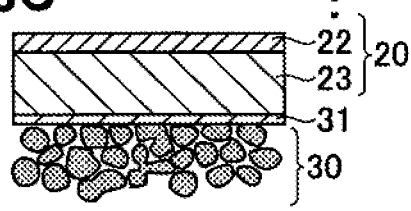

FIG. 8C is a schematic cross sectional view illustrating the state of the metal support 30 (copper crystal grains) at around 120° C. The temperature of 120° C. is the recrystallization temperature of copper constituting the metal support. In general, the recrystallization temperature is defined as that temperature at which recrystallization just reaches completion in one hour heating. For example, when the metal support 30 of the optical semiconductor device is heated at about 120° C. in the temperature raising process of the die-bonding step, the recrystallization and the formation of coarse large crystal grains start locally.

Figure 8D:
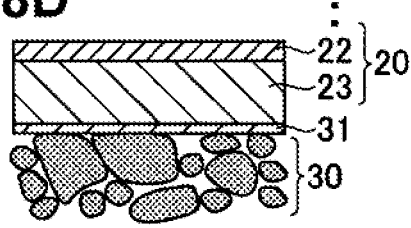

FIG. 8D is a schematic cross sectional view the same as that in the lower row of the first comparative example in FIG. 7. For example, when the optical semiconductor device with the metal support 30 having uneven density distributions of copper crystal grains and voids (as shown in FIG. 8B) is heated at about 315° C. (which is higher than the eutectic temperature for AuSn) for relatively short period of time in the die-bonding step, the crystal grain growing excessively proceeds at portion where the recrystallization and the crystal grain growing are likely to occur, thereby forming coarse large crystal grains locally. The metal support of the first comparative example was confirmed to include coarse grains with the particle diameter of 4 µm or more, the grains being in contact with the semiconductor film.

Figure 8E:
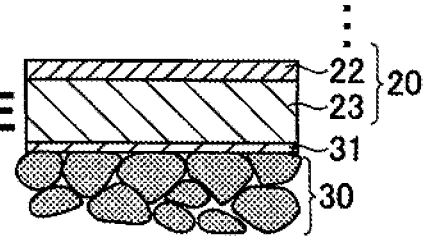

FIG. 8E is a schematic cross sectional view the same as that in the lower row of the second comparative example in FIG. 7. For example, when the optical semiconductor device with the metal support 30 having uneven density distributions of copper crystal grains and voids (as shown in FIG. 8B) is heated at about 315° C. for relatively short period of time in the die-bonding step, the metal support can have a crystal grain distribution having coarse particles with less voids. The metal support of the second comparative example was confirmed to include coarse grains with the particle diameter of 5 µm or more, and locally with the particle diameter of 7 µm or more, the grains being in contact with the semiconductor film.

Figure 8F:
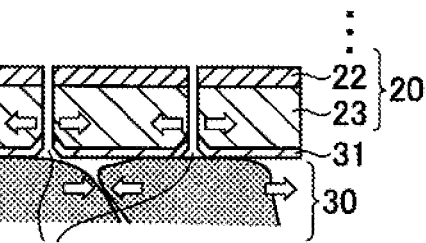

With reference to FIG. 8F, a description will be given of the crack formation. In general, the thermal expansion coefficient of copper that constitute the metal support 30 is approximately 3.3 times larger than that of the semiconductor film (GaN) 20. Accordingly, the heating in the die-bonding step will generate a force applied to the semiconductor film 20. The force is applied in the in-plane direction so as to draw the portions. In the comparative example, in particular, the second comparative example in which the metal support near the boundary of the semiconductor film 20 is composed of coarse particles, the void density is lowered while the copper density increases. When heat is applied in this state and the thermal expansion occurs, the coarse copper crystal grains push against each other, so that a large force is applied to the semiconductor film 20 in the direction in which the semiconductor film 20 is expanded. It is considered that this may cause cracking in the semiconductor film 20 in the die-bonding step.

Furthermore, pits having a triangular cross section are formed in the surface of the semiconductor film 20 due to threading dislocations. Since the pits are formed due to crystal defect, the semiconductor film 20 around the pit may be formed of relatively weak crystals. Accordingly, if the semiconductor film 20 is drawn in the expanding direction, the pit may be widened, thereby being likely to cause the semiconductor film 20 to break at the pits as starting points. Since the pits may be formed by lattice misfit between the different type substrate like a sapphire substrate and the semiconductor film, AlInGaN-based optical semiconductor devices that may utilize a different type substrate as a growth substrate may have a easy-broken semiconductor film 20.

Next, a description will be given of considering the reason why the semiconductor film of the optical semiconductor apparatus of the present embodiment does not break with reference to FIGS. 9A to 9C.

Figure 9A:
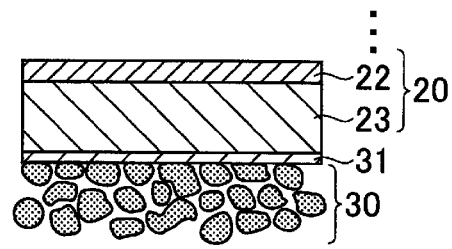
FIGS. 9A to 9C are cross sectional views illustrating how the breakage has not been generated in the semiconductor films according to the present example.

FIG. 9A is a schematic cross sectional view the same as that in the lower row of the present embodiment (optical semiconductor device) in FIG. 7. As described above, the metal support 30 of the optical semiconductor device of the present embodiment has uniform density distributions of copper crystal grains and voids. This may be considered due to the thermal treatment step.

Figure 9B:
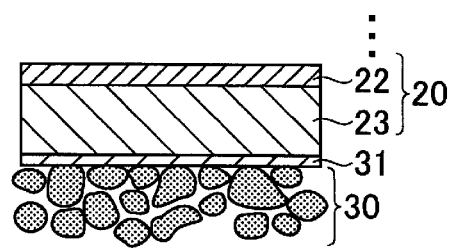

FIG. 9B is a schematic cross sectional view the same as that in the lower row of the other present embodiment (optical semiconductor apparatus) in FIG. 7. As described above, even after the optical semiconductor device was subjected to temperature change in accordance with the die-bonding step, the metal support 30 was configured such that the excessive growth of crystal grains is suppressed and the appropriate density distribution of voids is achieved.

Figure 9C:
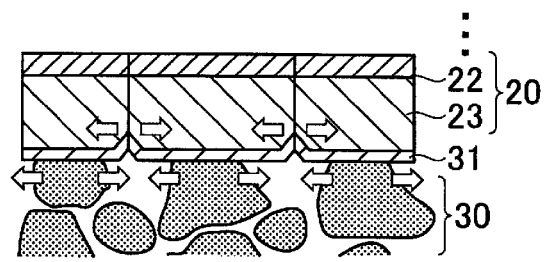

FIG. 9C is a schematic cross sectional diagram illustrating how the breakage has not been generated in the semiconductor films according to the present embodiment. The optical semiconductor device of the present embodiment has appropriate and uniform density distributions of the crystal grains and voids as shown in FIG. 9A, and even if the copper crystal grains are heat expanded by applied heat during the die-bonding step, the expansion may affect in the direction of the voids between the crystal grains, thereby decreasing the expansion amount of the metal support 30 as a total. Namely, if the optical semiconductor device is manufactured by processes including thermal treatment like the present embodiment, the metal support 30 may have a heat expansion coefficient that is substantially small. Accordingly, the difference of the heat expansion coefficient between the metal support 30 and the semiconductor film 20 becomes small. In this case, even if the heat is applied in the die-bonding step (for example, eutectic junction formation of AuSn solder carried out at 315° C.), it is considered that the semiconductor film 20 may not break.

Since the optical semiconductor apparatus of the present embodiment can be configured such that the excessive growth of crystal grains as being a cause of breakage of semiconductor film is suppressed and the appropriate uniform density distributions of crystal grains and voids are achieved even after the eutectic junction formation is achieved using AuSn solder with high Au content, such an apparatus is considered to be superior in mass producibility and reliability.

The method for manufacturing an optical semiconductor device in accordance with the present embodiment can include a thermal treatment step, in which the density distributions of the crystal grains and voids are evened due to the crystal grain migration during heating and heat maintaining in the thermal treatment step. After heating is completed, the crystal grains may be changed into fine crystal grains due to the cooling. At this time, the density distributions are evened much more.

The temperature raising rate during the heating in the thermal treatment step is preferably adjusted in a range of 15 to 35° C./second. If the rate is larger than this, sufficient migration of copper crystal grains does not take place within the metal support, whereby it would be difficult to even the density distributions of crystal grains and voids. If the rate is slower than this, coarse crystal grains may be formed easily in a region where the crystal growth is likely to proceed, and the semiconductor film may break during the die-bonding step.

The maintaining temperature during the temperature maintenance in the thermal treatment step is preferably the recrystallization temperature ±20° C. The maintaining time may be 5 minutes or less, and preferably from 1 to 3 minutes. The recrystallization temperature may vary depending on not only the type of the material but also the states of processing, density and the like. Accordingly, even if the metal support formed by plating is subjected to thermal treatment at or near the recrystallization temperature for a given maintaining time, the degrees of recrystallization and crystal grain growth may vary at various portions. When the maintaining temperature and/or the maintaining time are lower than the range, the appropriate migration does not take place, whereby the formation of metal support with a uniform density distribution is not achieved. When the maintaining temperature and/or the maintain time exceed the range, the migration and/or the crystal grain growth excessively proceed, thereby forming a metal support with high density and much coarse crystal grains. This leads to the breakage of semiconductor film in the die-bonding step.

When the thermal treatment step is employed, which repeats the temperature raising, maintaining, and lowering a plurality of time while changing the maintaining temperature as described above with reference to FIG. 5B, the optimum crystal grain diameter and void density distribution can be achieved at the respective regions where the recrystallization and crystal grain growth progress with different degrees.

The preferable temperature lowering rate is 15 to 35° C./second. If such a relatively slow rate is adopted, when the metal support is cooled to, for example, room temperature, it is considered that the crystal grains that are being changed to coarse crystal grains can be contracted, thereby being separated again. If the temperature lowering rate is smaller, crystal growth may occur during cooling. If the rate is larger, rapid cooling may cause rapid contraction, whereby the semiconductor film may break or the metal support may deform.

If such a thermal treatment step is performed, the metal support can be formed without coarse crystal grains generated and with the uniform density distributions of the crystal grains and voids.

The present invention has been described above with reference to several embodiments, but the invention is not limited thereto.

Although the metal support is formed of copper in the embodiments, if the metal support is formed of copper containing 1 wt % or less of additive(s), the same advantageous effects can be obtained as in the embodiments. Accordingly, when the material of the metal support is copper, "copper" means pure copper as well as copper containing 1 wt % or less of an additive(s).

The thermal treatment step in the embodiments can be performed by raising the temperature of the metal support and then lowering it to near room temperature, but the present invention is not limited thereto. When the temperature is lowered to 0° C. or more and 50° C. or less, the same advantageous effects can be obtained as in the embodiments.

Further, in the embodiments, the thermal treatment step can include a temperature raising process, temperature maintaining process, and temperature lowering process, but the present invention is not limited thereto. The thermal treatment step can omit the heat maintaining process.

When the manufacturing method includes an n-electrode formation step where an alloying process is included, the thermal treatment step may be performed before the n-electrode formation step.

Furthermore, the n-electrode formation step is performed by, after the growth substrate is removed, forming an n-electrode on the surface of the n-type semiconductor layer that is exposed by removing the growth substrate. However, the present invention is not limited thereto. For example, the p-type semiconductor layer and the active layer can be partially removed after the semiconductor layer formation step and before the metal support formation step, and then the n-electrode can be formed on the thus exposed n-type semiconductor layer. In this case, while the n-electrode and the p-electrode are electrically isolated with each other, the p-electrode and the metal support on the n-electrode can be formed in such a manner that a required region of the metal support is electro-decomposed after the metal support formation step, or that the n-electrode and/or the insulating film surrounding the p-electrode are formed, and then the metal support is formed by plating, or the like.

The wire-bonding step, resin sealing step, and the like can be optionally performed depending on the device type, intended purpose, and the like.

In the embodiment, the optical semiconductor device is die bonded onto a metal stem, but the present invention is not limited to such a stem type member including conductive stems formed of metal. For example, the optical semiconductor device can be die bonded onto a metal pattern formed on a power supply conductive member of a resin substrate.

It will be apparent to those skilled in the art that various modifications and variations can be made in the presently disclosed subject matter without departing from the spirit or scope of the presently disclosed subject matter. Thus, it is intended that the presently disclosed subject matter cover the modifications and variations of the presently disclosed subject matter provided they come within the scope of the appended claims and their equivalents. All related art references described above are hereby incorporated in their entirety by reference.

What is claimed is:

1. A method for manufacturing an optical semiconductor device, comprising:
   (a) preparing a growth substrate;
   (b) forming a semiconductor layer on the growth substrate;
   (c) forming a metal support made of copper on the semiconductor layer by plating;
   (d) separating the growth substrate from the semiconductor layer to remove the growth substrate; and
   (e) carrying out a thermal treatment in order to even density distributions of crystal grains and voids in the copper forming the metal support.

2. The method for manufacturing an optical semiconductor device according to claim 1, wherein in the step (e) the metal support is heated to 100 to 140° C., and then cooled to 50° C. or lower.

3. The method for manufacturing an optical semiconductor device according to claim 2, wherein in the step (e) the metal support is heated at a temperature raising rate of 15 to 35° C./second.

4. The method for manufacturing an optical semiconductor device according to claim 2, wherein in the step (e) the metal support is cooled at a temperature lowering rate of 15 to 35° C./second.

5. The method for manufacturing an optical semiconductor device according to claim 3, wherein in the step (e) the metal support is cooled at a temperature lowering rate of 15 to 35° C./second.

6. The method for manufacturing an optical semiconductor device according to claim 2, wherein in the step (e) the metal support is heated to 100 to 140° C., maintained within 100 to 140° C. for 5 minutes or lower, and then cooled to 50° C. or lower.

7. The method for manufacturing an optical semiconductor device according to claim 3, wherein in the step (e) the metal support is heated to 100 to 140° C., maintained within 100 to 140° C. for 5 minutes or lower, and then cooled to 50° C. or lower.

8. The method for manufacturing an optical semiconductor device according to claim 4, wherein in the step (e) the metal support is heated to 100 to 140° C., maintained within 100 to 140° C. for 5 minutes or lower, and then cooled to 50° C. or lower.

9. The method for manufacturing an optical semiconductor device according to claim 5, wherein in the step (e) the metal support is heated to 100 to 140° C., maintained within 100 to 140° C. for 5 minutes or lower, and then cooled to 50° C. or lower.

10. The method for manufacturing an optical semiconductor device according to claim 6, wherein in the step (e) the metal support is heated to 100 to 140° C., maintained within 100 to 140° C. for 1 to 3 minutes, and then cooled to 50° C. or lower.

11. The method for manufacturing an optical semiconductor device according to claim 7, wherein in the step (e) the metal support is heated to 100 to 140° C., maintained within 100 to 140° C. for 1 to 3 minutes, and then cooled to 50° C. or lower.

12. The method for manufacturing an optical semiconductor device according to claim 8, wherein in the step (e) the metal support is heated to 100 to 140° C., maintained within 100 to 140° C. for 1 to 3 minutes, and then cooled to 50° C. or lower.

13. The method for manufacturing an optical semiconductor device according to claim 9, wherein in the step (e) the metal support is heated to 100 to 140° C., maintained within 100 to 140° C. for 1 to 3 minutes, and then cooled to 50° C. or lower.

14. The method for manufacturing an optical semiconductor device according to claim 2, wherein in the step (e) the metal support is heated to 100 to 140° C., and then cooled to 50° C. or lower, and the heating and cooling are performed a plurality of times.

15. The method for manufacturing an optical semiconductor device according to claim 3, wherein in the step (e) the metal support is heated to 100 to 140° C., and then cooled to 50° C. or lower, and the heating and cooling are performed a plurality of times.

16. The method for manufacturing an optical semiconductor device according to claim 4, wherein in the step (e) the metal support is heated to 100 to 140° C., and then cooled to 50° C. or lower, and the heating and cooling are performed a plurality of times.

17. The method for manufacturing an optical semiconductor device according to claim 6, wherein in the step (e) the metal support is heated to 100 to 140° C., and then cooled to 50° C. or lower, and the heating and cooling are performed a plurality of times.

18. The method for manufacturing an optical semiconductor device according to claim. 10, wherein in the step (e) the metal support is heated to 100 to 140° C., and then cooled to 50° C. or lower, and the heating and cooling are performed a plurality of times.

19. The method for manufacturing an optical semiconductor device according to claim 1, wherein the growth substrate is a sapphire substrate.

20. The method for manufacturing an optical semiconductor device according to claim 1, wherein in the step (b) the semiconductor layer is formed of family III nitride semiconductor represented by $Al_xIn_yGa_zN$ (wherein $0 \leqq x \leqq 1$, $0 \leqq y \leqq 1$, $0 \leqq z \leqq 1$).

21. The method for manufacturing an optical semiconductor device according to claim 1, further comprising, between the steps (d) and (e) or after the step (e),
   (f) forming an electrode on the semiconductor layer from which the growth substrate has been removed in the step (d).

22. A method for manufacturing an optical semiconductor apparatus, comprising:
   (a) preparing a growth substrate;
   (b) forming a semiconductor layer on the growth substrate;
   (c) forming a metal support made of copper on the semiconductor layer by plating;
   (d) separating the growth substrate from the semiconductor layer to remove the growth substrate;
   (e) carrying out a thermal treatment in order to even density distributions of crystal grains and voids in the copper forming the metal support; and
   (f) forming a eutectic junction between the metal support and a conductive member using an AuSn solder with an Au content of 78 to 80 wt %.

* * * * *